United States Patent [19]
Kobayashi

[11] Patent Number: 5,814,432
[45] Date of Patent: Sep. 29, 1998

[54] METHOD OF FORMING PATTERNS FOR USE IN MANUFACTURING ELECTRONIC DEVICES

[75] Inventor: Yoshihito Kobayashi, Kawasaki, Japan

[73] Assignee: Kabushiki Kaisha Toshiba, Kawasaki, Japan

[21] Appl. No.: 551,314

[22] Filed: Nov. 1, 1995

[30] Foreign Application Priority Data

Nov. 7, 1994 [JP] Japan .................................... 6-272276

[51] Int. Cl.$^6$ ...................................................... G03C 5/00
[52] U.S. Cl. ...................... 430/312; 430/327; 430/394; 430/330; 430/296
[58] Field of Search ...................... 430/312, 327, 430/330, 394, 296

[56] References Cited

U.S. PATENT DOCUMENTS

| | | | |
|---|---|---|---|
| 4,533,624 | 8/1985 | Sheppard | 430/312 |
| 4,690,880 | 9/1987 | Suzuki et al. | 430/313 |
| 5,279,921 | 1/1994 | Onishi et al. | 430/270 |
| 5,292,614 | 3/1994 | Ochiai et al. | 430/270 |
| 5,326,675 | 7/1994 | Niki et al. | 430/326 |
| 5,403,695 | 4/1995 | Hayase et al. | 430/192 |
| 5,561,011 | 10/1996 | Miyazaki et al. | 430/7 |
| 5,585,217 | 12/1996 | Oba | 430/191 |
| 5,679,497 | 10/1997 | Kimura | 430/296 |
| 5,686,223 | 11/1997 | Cleeves | 430/312 |

*Primary Examiner*—M. Nuzzolillo
*Assistant Examiner*—Steven H. VerSteeg
*Attorney, Agent, or Firm*—Finnegan, Henderson, Farabow, Garrett & Dunner, L.L.P.

[57] ABSTRACT

In a method of forming patterns for use in manufacturing electronic devices, a radiation-sensitive layer is formed on a semiconductor substrate by coating a radiation-sensitive composition containing a compound which generates acid by chemical radiation and a compound which has one bond capable of being decomposed by the acid generated. Then, an area of the radiation-sensitive layer adjacent to a predetermined pattern-formation area is irradiated. Subsequently, a surface of the radiation-sensitive layer is treated with a basic compound and washed, thereby inactivating the acid generated in the irradiation area. Thereafter, the predetermined pattern-formation area of the radiation sensitive layer treated with the basic compound is irradiated, followed by applying heat treatment to the substrate. Last, the radiation-sensitive layer is developed. With the method, a fine pattern having a rectangular cross-section together with suppressing size alteration caused by scattered light can be formed.

29 Claims, No Drawings

METHOD OF FORMING PATTERNS FOR USE IN MANUFACTURING ELECTRONIC DEVICES

BACKGROUND OF THE INVENTION

1. Field of the Invention

The present invention relates to a method of forming patterns for use in fine-processing step of manufacturing electronic devices such as large scale integrated circuits (LSI).

2. Description of the Related Art

In the field of various electronic devices including semiconductor integrated circuits requiring fine-processing technique, photolithography is employed to manufacture the electronic devices. In the manufacturing step of the electronic devices using the photolithography, a photoresist film is formed on a structure including a metal layer or insulating layer formed on a silicon wafer substrate, by a spin-coat method. Hereinafter such a structure will be referred to as "substrate" for simplicity of explanation. Subsequently, the photoresist film is exposed to light, developed and rinsed, making resist patterns. Using the resist patterns thus-obtained as etching masks, the metal layer or the insulating layer not-covered by the etching patterns is etched, thereby forming wirings or openings.

To make fine patterns, the shorter the wavelength of the light, the more preferable. To be more specific, fine patterns can be formed by using short-wavelength light such as an excimer laser beam or an electron beam, or an X ray having a shorter wavelength than that of the excimer laser beam.

However, since a conventional resist absorbs a large amount of the short-wavelength light, the light cannot reach deep inside the resist film. Consequently, patterns after being developed have a triangular cross-section in the case of a negative-film. When a positive-resist is used, the patterns after being developed have an inverted triangular cross section. The resists having such patterns are disadvantageous in that their function as an etching mask is considerably low.

To overcome the aforementioned disadvantages, chemically sensitized resists have been proposed in the prior art. The chemically sensitized resist contains a compound called a photo acid generator capable of generating acid by photoradiation and a compound having a hydrophobic group, which is converted into a hydrophilic substance after the hydrophobic group is decomposed by the generated acid. Specific examples of the conventional chemically sensitized resists include a positive-type resist containing poly(p-hydroxystylene) whose hydroxyl group is blocked with a butoxycarbonyl group, and an onium salt; a positive-type resist containing a m-cresol novolak resin and naphthalene-2-carboxylic acid-tert-butylester, and a triphenylsulfonium salt; and a positive-type resist containing 2,2-bis(4-tert-butoxycarbonyloxyphenyl)propane, polyphthalic aldehyde and an onium salt.

Since the photo acid generator acts as a catalyst, the chemically-sensitized resist effectively responds with light for use in pattern-formation even if contained in a small amount. The reaction proceeds deeply inside the resist, thereby successfully forming a resist pattern having a rectangular cross-section.

The chemically sensitized resists are described in the following literatures:

1) H. Ito, C. G. Wilson, J. M. J. Franchet, U.S. Pat. No. 4,491,628 (1985)

This literature discloses a positive resist containing poly(p-hydroxystylene) whose hydroxyl group is modified with a butoxycarbonyl group and an onium salt capable of generating acid by photoradiation.

2) M. J. O. Brien, J. V. Crivello, SPIE Vol, 920, Advances in Resist Technology and Processing, p42, (1988)

This literature discloses a positive resist containing a m-cresol novolak resin, naphthalene-2-carboxylic acid tert-butylester, and a triphenylsulfonium salt capable of generating acid by photoradiation.

3) H. Ito, SPIE Vol, 920, Advances in Resist Technology and Processing, p33, (1988).

This literature discloses a positive resist containing 2,2-bis(4-tert-butoxycarbonyloxyphenyl) propane, polyphthalic aldehyde, and an onium salt capable of generating acid by photoradiation.

However, the aforementioned chemically-sensitized resists have a problem since they are excessively sensitive to light. To be more specific, the periphery of a desired pattern-formation area is influenced by scattered light when light is applied on the predetermined pattern-formation area, with the result that the size of the resist pattern will be altered.

SUMMARY OF THE INVENTION

The present invention has been made with the view toward solving the aforementioned problems in the prior art. The present invention is intended to provide a method of forming patterns for use in manufacturing electronic devices, which comprises using a chemically-sensitized resist and applying photolithography onto the chemically-sensitized resist using a short-wavelength chemical radiation such as an ultraviolet ray or an ionizing radiation. As a result, the present invention made it possible to form fine patterns having a rectangular cross-sectional shape together with suppressing size alteration caused by scattered chemical radiation.

The method of forming patterns for use in manufacturing electronic devices according to the present invention comprises the steps of:

forming a radiation sensitive layer on a substrate by coating a radiation sensitive composition which contains a compound capable of generating acid by chemical radiation and a compound having at least one bond capable of being decomposed by the generated acid;

irradiating an area of the radiation sensitive layer other than a predetermined pattern-formation area;

treating the surface of the radiation-sensitive layer with a basic compound, thereby inactivating acid generated in the irradiation area;

irradiating the predetermined pattern-formation area of the radiation sensitive layer treated with the basic compound;

applying heat treatment to the substrate; and developing the radiation sensitive layer.

To describe more specifically, first, a resist layer is formed by coating a substrate with a resist which contains a compound capable of generating acid by chemical radiation and a compound having a bond capable of being decomposed by the generated acid. Then, the area of the resist layer other than a predetermined pattern-formation area is irradiated, thereby exposing to light the area which is influenced by scattered light when the predetermined pattern-formation area is irradiated in a later step. Subsequently, the surface of the resist layer is treated with a basic compound, thereby inactivating acid generated in the irradiation area. This procedure reduces the light-sensitivity of the area which is influenced by scattered light when the predetermined pattern-formation portion is irradiated in the later step. In other words, the area mentioned above becomes scarcely influenced by the scattered light. Then, the predetermined pattern-formation area is irradiated, generating acid therein. Thereafter, by performing heat treatment, the generated acid is reacted with a compound having a bond capable of being decomposed by the generated acid. Since the solubility of the resist layer to a developing solution changes owing to the reaction, desired resist patterns are obtained by subjecting the resist layer to developing treatment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

Hereinbelow, we will describe an embodiment according to a method of forming patterns for use in manufacturing electronic devices of the present invention. First, on a substrate is coated a radiation sensitive composition containing a compound as a first component which generates acid by chemical radiation and a compound as a second component which has at least one bond capable of being decomposed by the generated acid. The coating is performed by a spin-coating method or a deposition method. The coated layer is then dried at a temperature of 200° C. or less, preferably at a temperature from 60° to 150° C. As a result, a resist film formed of a radiation sensitive composition is obtained. As the substrate, use may be made of a semiconductor wafer such as a silicon wafer or a GaAs wafer on which any treatment for element formation has not been applied; a semiconductor wafer on which various insulating films, electrodes or wiring are formed in preparation for element formation; and a blank mask.

The chemical radiation may be appropriately selected depending upon a nature of a compound used as a first component which generates acid by chemical radiation. Examples of the chemical radiation include various ultraviolet rays such as an i-ray, h-ray or g-ray of a mercury lamp; an excimer laser beam such as a KrF-ray or ArF-ray; X-ray; electronic beam; ionic beam or the like.

The compound as a first component contained in the radiation sensitive composition, capable of generating acid by chemical radiation is not particularly limited. Various known compounds and mixture thereof may be used. Examples of the compound as a first component include diazonium salts, phosphonium salts, sulfonium salts such as $CF_3SO_3^-$, $P—CH_3PHSO_3^-$, and $P—NO_2PHSO_3^-$, iodonium salts, organic halogen compounds, orthoquinone-diazidosulfonylchloride and the like.

The compound as a second component contained in the radiation sensitive composition, having at least one compound capable of being decomposed by acid is not particularly limited. Specifically, a compound may be used as long as it can be decomposed by acid to change the solubility of a resist to a developing solution. More specifically, esters or ethers of a phenol compound are preferable. Examples of the phenol compound include phenol, cresol, xylesole, bisphenol A, bisphenol S, hydroxybenzophenone, phenolphthalein, polyvinylphenol, and a novolak resin. The hydroxyl group of the phenol compound is esterified or etherified using an appropriate esterification or etherification agent. Examples of the esterification agent and etherification agent include methylester, ethylester, n-propylester, isopropylester, tert-butylester, n-butylester, isobutylester, benzylester, tetrahydropyranyl ether, benzyl ether, methyl ether, ethyl ether, n-propyl ether, isopropyl ether, tert-butyl ether, allyl ether, methoxymethyl ether, p-bromophenacyl ether, trimethylsilyl ether, benzyloxycarbonyl ether, tert-butoxycarbonyl ether, tert-butylacetate, and 4-tert-butylbenzyl ether.

The radiation sensitive composition used herein may contain alkali-soluble polymer as a third component in addition to the first and second components. The alkali-soluble polymer has a function of improving resolution of patterns by changing a dissolution rate of the layer made of the radiation sensitive composition relative to the alkali development solution. Examples of the alkali-soluble resin include a phenol novolak resin, cresol novolak resin, xylesol novolak resin, and vinylphenol resin.

The radiation sensitive composition, if necessary, may further contain a surfactant serving as a coating-film reforming agent, a coloring agent serving as a reflection inhibitor, in addition to the first, second and third components.

The content of the compound as a first component capable of generating acid by the chemical radiation falls within the range from 0.1 to 30 wt %, more preferably from 0.3 to 15 wt % based on the solid component of the radiation sensitive composition. This is because if the content is less than 0.1 wt %, it will be difficult to obtain sufficient sensitization characteristics; in contrast, if the content exceeds 30 wt %, it may be difficult to uniformly mix other components.

The alkali-soluble polymer as a third component is preferably contained in an amount of 90 wt % or less, more preferably in an amount of 80 wt % or less based on the total amount of the second component and the alkali-soluble polymer. This is because if the content of the alkali-soluble polymer exceeds 90 wt %, the difference between light exposed portion and non-exposed portion in a dissolution rate of the radiation sensitive composition relative to a developing solution, will be small. Consequently, a low-resolution pattern is formed.

The radiation sensitive composition is prepared by the steps of dissolving the first, second components in an organic solvent and filtrating the resultant mixture. If necessary, an alkali-soluble polymer, surfactant and coloring agent may be added to the mixture.

Examples of the organic solvent used herein include ketone-series solvents such as cyclohexanone acetone, methyl ethyl ketone, and methyl isobutyl ketone; cellosolve-series solvents such as methyl cellosolve, methyl cellosolve acetate, ethyl cellosolve, ethyl cellosolve acetate, butyl cellosolve, and butyl cellosolve acetate; ester-series solvents such as ethyl acetate, butyl acetate, isoamyl acetate, ethyl lactate, and methyl lactate; alcohol-series solvents such as 2-butanol, isoamyl alcohol, and diethylene glycol; solvents made of polyhydric alcohol derivative such as ethylene glycol diethyl ether, diethylene glycol monoethyl ether, and ethyl carbitol; morpholine; N-methyl-2-pyrrolidone; and the like. The aforementioned solvent can be used alone or a mixture thereof.

After completion of the resist film formation, an ultraviolet ray such as an i-ray, h-ray, or g-ray of a mercury lamp, an excimer laser beam such as KrF and ArF, or X-ray is radiated onto an area of the radiation sensitive layer other than a desired pattern-formation area through a mask having a desired pattern. Alternatively, electron beam or ionic beam may be directly radiated without using the mask. As a result of the chemical radiation mentioned above, acid is generated from a compound as a first component contained in the radiation sensitive composition.

The area of the radiation sensitive layer other than a desired pattern-formation area is defined as an area which is presumably influenced by scattered light when the desired pattern-formation area is radiated. It is practically defined as an area within the range of 10 μm or less around the desired pattern-formation area. More practically, the area is within the range of 5 μm or less around the desired pattern-formation area.

The amount of light radiated onto the area other than the desired pattern-formation area is not particularly limited. The amount of the light is preferred to control in such a way that the scattered light does not influence on the pattern-formation area. To be more specific, the radiation amount desirably falls within the range from 30 to 100% based on a radiation amount with which the pattern-formation area is irradiated.

After completion of the radiation onto the area of a substrate other than the predetermined pattern-formation area, the surface of the substrate was treated with a basic compound, thereby inactivating acid generated in the irradiated area.

The basic compound used herein is not particularly limited. Various amine compounds may be used. Examples of the amine compounds include triethylamine, aniline, pyridine, diethylamine, ammonia, tetramethylammonium hydroxide, hexamethyldisilazane, triphenylamine, 2,4,5-triphenyl imidazole, 2-phenylimidazole, 4,4'-diaminodiphenylmethane, nicotinic acid amide, 2-ethyl imidazole, 3,3'-diamino-4-4'-dihydroxydiphenyl, 2,2,2-trifluoroacetamide, and benzothiazole.

Examples of the method of treating the surface with the basic compound include a method of exposing a substrate to a gasified basic compound; a method of soaking a substrate in a solution containing a basic compound; and a method of spraying a solution containing a basic compound onto a substrate. However, the method of treating the surface with a basic compound is not particularly limited to the aforementioned methods.

After the surface of radiation sensitive layer is treated with the basic compound, a desired pattern-formation area is irradiated through a mask having a desired pattern by an ultraviolet ray such as an i-ray, h-ray, or g-ray of a mercury lamp, an excimer laser beam such as KrF and ArF, or an X-ray. Alternatively, an electron beam or ionic beam may be directly radiated without using a mask. As a result of the chemical radiation mentioned above, acid is generated from a compound as a first component contained in the radiation sensitive composition.

Subsequently, the resultant substrate is treated with heat. Then, the acid generated by radiation reacts with a compound as a second component having at least one bond capable of being decomposed by the generated acid.

The heat treatment may be performed by use of an oven or a hot-plate. However, the heat treatment method used herein is not particularly limited to these methods. The heating temperature is not particularly limited, either, and is preferred to fall within the range of 50° to 150° C., in general.

After completion of the heat treatment, the radiation sensitive layer is developed with an aqueous alkaline solution serving as a developing solution, thereby forming resist patterns. The resultant radiation sensitive layer is washed with pure water to remove the development solution therefrom, and then dried.

Examples of the aqueous alkaline solution serving as a developing solution include an aqueous solution of an inorganic alkali such as potassium hydroxide, sodium hydroxide, sodium carbonate, sodium silicate, or sodium methasilicate; and an aqueous solution of an organic alkali such as an aqueous solution of tetramethylammonium hydroxide or an aqueous solution of trimethylhydroxyethylammonium hydroxide, or the aqueous solution of an inorganic or organic alkali to which an alcohol and/or a surfactant are/is added.

To reiterate, in the aforementioned embodiment of the present invention, first, a resist layer is formed by coating a resist containing a compound capable of generating acid by chemical radiation and a compound containing at least one bond capable of being decomposed by the generated acid. Second, the area of the resist layer other than predetermined pattern-formation area is exposed to chemical radiation, thereby exposing to light the area which is presumably influenced by scattered light when the predetermined pattern-formation area is irradiated in a later step.

Third, the surface of the resultant substrate is treated with a basic compound to inactivate the acid generated in the irradiated area. By virtue of this treatment, the sensitivity of the treated area to light decreases, with the result that the area is scarcely influenced by the scattered light at the time of chemical radiation held in the later step.

Fourth, the desired pattern-formation area is exposed to chemical radiation, generating acid therein. The acid is then allowed to react with a compound having at least one bond capable of being decomposed with the acid generated in the pattern-formation area by subjecting the substrate to heat treatment. Consequently, the solubility of the resist in a developing solution is changed. Then, the substrate is subjected to development treatment, affording a desired pattern.

In summary, the periphery of the desired pattern-formation area is scarcely influenced by scattered light at the time of chemical radiation held in the later step. Consequently, resist patterns having a rectangular cross-section can be formed.

Hereinbelow, we will specifically describe examples of preparing radiation sensitive compositions.

The radiation sensitive compositions (RE-1 to RE-6) were prepared by the following steps. First, a mixture is prepared using a compound capable of generating acid by radiation, a compound having at least one bond capable of being decomposed by acid. To this mixture, if necessary, an alkali-soluble polymer may be added in accordance with the formulation percentages shown in Table 1. Then, the mixture thus obtained was dissolved in an organic solvent indicated in Table 1 in accordance with the amount listed therein. Thereafter, the resultant mixture was filtrated through a cellulose membrane filter of 0.2 μm in diameter.

It should be noted that the chemical formulas of the compounds (A-1), (A-2) and (A-3), which are capable of generating acid by radiation; the compounds (B-1), (B-2) and (B-3) which are a compound having at least one bond capable of being decomposed by acid; and alkali-soluble polymers (C-1) and (C-2) employed in the compositions are individually shown below.

Compounds generating acid (A-1)
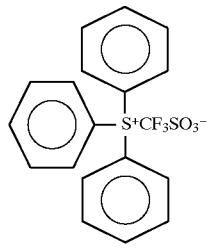

(A-2)
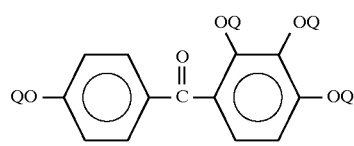

(A-3)
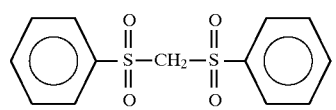

Q:
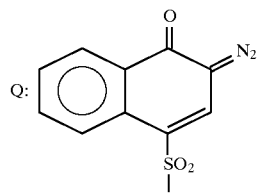

Compounds decomposed by acid (B-1)
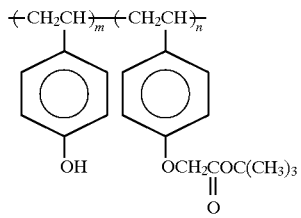

(B-2)
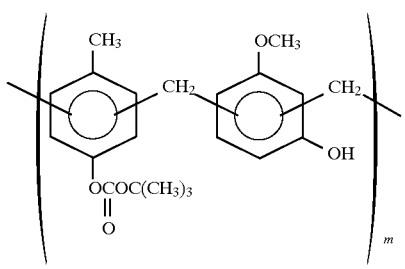

(B-3)
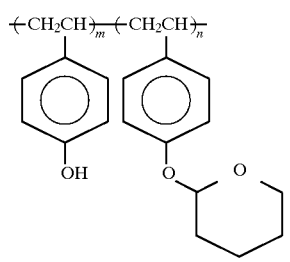

Alkali-soluble polymer (C-1)
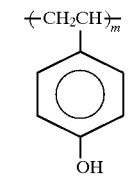

(C-2)
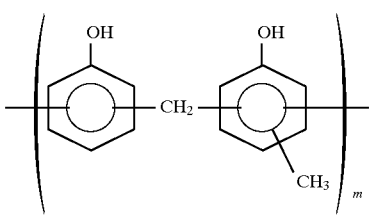

TABLE 1

| Radiation sensitive composition | Compound generating acid (Content) | Compound decomposed by acid (Content) | Alkali-soluble polymer (Content) | Organic solvent (Content) |
|---|---|---|---|---|
| RE-1 | A-1 (0.2 g) | B-1 (24.8 g) | — | Ethyl cellosolve acetate (75.0 g) |
| RE-2 | A-2 (2.0 g) | B-1 (18.0 g) | C-1 (5.0 g) | Ethyl cellosolve acetate (75.0 g) |
| RE-3 | A-3 (1.8 g) | B-1 (15.2 g) | C-1 (8.0 g) | Ethyl cellosolve acetate (75.0 g) |
| RE-4 | A-2 (1.1 g) | B-2 (14.0 g) | C-2 (6.9 g) | Ethyl lactate (78.0 g) |
| RE-5 | A-1 (0.1 g) | B-1 (20.0 g) | C-1 (4.9 g) | Ethyl cellosolve acetate (75.0 g) |
| RE-6 | A-1 (0.3 g) | B-3 (24.7 g) | — | Ethyl cellosolve acetate (75.0 g) |

Hereinbelow, we will describe Examples 1 to 6 and in comparison with the corresponding Comparative Examples 1 to 6.

(EXAMPLE 1)

A radiation sensitive composition RE-1 listed in Table 1 was spin-coated on a 6-inch silicon wafer. The coated silicon wafer was pre-baked for 90 seconds on a hot plate of 90° C. As a result, a radiation sensitive composition layer, namely, a resist film was formed in a thickness of 1.0 μm. Subsequently, the area of the resist film other than a predetermined pattern formation area was irradiated by a KrF excimer laser stepper through a mask in a radiation rate of 25 mJ/cm². The resultant resist film was treated with a basic compound by standing still in an ammonia atmosphere for 30 minutes. Then, the predetermined pattern-formation area was irradiated by a KrF excimer laser stepper through a mask at a radiation rate of 30 mJ/cm². The resultant resist film was baked on a hot plate of 100° C. for 90 seconds and soaked in a 2.38% aqueous solution of tetramethylammonium hydroxide (hereinafter simply referred to as "aqueous TMAH solution") for 60 seconds, thereby developing the resist. Thereafter, the resist was washed with water and dried, forming resist patterns.

The resist patterns thus-obtained were observed under a scanning electron microscope (hereinafter referred to as "SEM"). It was confirmed that isolated resist patterns were formed in a width of 0.3 μm and that lined-and-spaced resist patterns were obtained also in the same width as that of the isolated resist patterns. The influence of scattered light was not observed. The isolated resist patterns mean resist patterns isolated from each other, and the lined-and-spaced resist patterns mean resist patterns arranged in parallel, with a space therebetween.

(COMPARATIVE EXAMPLE 1)

Resist patterns were formed in the same manner and conditions as in Example 1 except that radiation onto the area other than a predetermined pattern-formation area and treatment with a basic compound were not performed. When the resist patterns thus obtained were observed under SEM, it was confirmed that isolated resist patterns were obtained in a width of 0.3 µm but that lined-and-spaced resist patterns were obtained in a different width.

(EXAMPLE 2)

A radiation sensitive composition RE-2 listed in Table 1 was spin-coated on a 6-inch silicon wafer. The coated silicon wafer was pre-baked for 300 seconds on a hot plate of 90° C. As a result, a radiation sensitive composition layer, namely, a resist film was formed in a thickness of 1.0 µm. Subsequently, the peripheral resist film within the range of 5 µm around a predetermined pattern-formation area was irradiated by a KrF excimer laser stepper through a mask in a radiation rate of 30 mJ/cm². The resultant resist film was treated with a basic compound by standing still in an ammonia atmosphere for 15 minutes. Then, the predetermined pattern-formation area was irradiated by a KrF excimer laser stepper through a mask at a radiation rate of 40 mJ/cm². The resultant resist film was baked on a hot plate of 110° C. for 120 seconds and soaked in a 2.38% aqueous TMAH solution for 45 seconds, thereby developing the resist. Thereafter, the resist was washed with water and dried to form resist patterns.

The resist patterns thus-obtained were observed under SEM. It was confirmed that isolated resist patterns were formed in a width of 0.3 µm and lined and spaced resist patterns were obtained also in the same width as that of the isolated resist patterns. The influence of scattered light was not observed.

(COMPARATIVE EXAMPLE 2)

Resist patterns were formed in the same manner and conditions as in Example 2 except that radiation onto the area other than a predetermined pattern-formation area and treatment with a basic compound were not performed. When the resist patterns thus obtained were observed under SEM, it was confirmed that isolated resist patterns were obtained in a width of 0.3 µm but lined-and-spaced resist patterns were obtained in a different size.

(EXAMPLE 3)

A radiation sensitive composition RE-3 listed in Table 1 was spin-coated on a 6-inch silicon wafer. The coated silicon wafer was pre-baked for 120 seconds on a hot plate of 100° C. As a result, a radiation sensitive composition layer, namely, a resist film was formed in a thickness of 1.0 µm. Subsequently, the peripheral resist film within the range of 2.0 µm around a predetermined pattern-formation area was irradiated by an electron beam at an accelerating voltage of 20 keV and at a radiation volume of 4 µc/cm². The resultant resist film was treated with a basic compound by standing still in an ammonia atmosphere for 30 minutes. Then, the predetermined pattern-formation area was irradiated by an electron beam at an accelerating voltage of 20 keV and at a radiation volume of 4 µc/cm². The resultant resist film was baked on a hot plate of 110° C. for 120 seconds and soaked in a 2.38% aqueous TMAH solution for 60 seconds, thereby developing the resist. Thereafter, the resist was washed with water and dried to form resist patterns.

The resist patterns thus-obtained were observed under SEM. It was confirmed that isolated resist patterns were formed in a width of 0.3 µm and that lined-and-spaced resist patterns were obtained also in the same width as that of the isolated resist patterns. The influence of scattered light was not observed.

(COMPARATIVE EXAMPLE 3)

Resist patterns were formed in the same manner and conditions as in Example 3 except that radiation onto the area other than a predetermined pattern-formation area and treatment with a basic compound were not performed. When the resist patterns thus obtained were observed under SEM, it was confirmed that isolated resist patterns were formed in a width of 0.3 µm but that lined-and-spaced resist patterns were obtained in a different width.

(EXAMPLE 4)

A radiation sensitive composition RE-4 listed in Table 1 was spin-coated on a 6-inch silicon wafer. The coated silicon wafer was pre-baked for 150 seconds on a hot plate of 90° C. As a result, a radiation sensitive composition layer, namely, a resist film was formed in a thickness of 1.0 µm. Subsequently, the peripheral resist film other than a predetermined pattern formation area was irradiated by an i-ray stepper at a radiation rate of 70 mJ/cm² through a mask. The resultant resist film was treated with a basic compound by standing still in an ammonia atmosphere for 30 minutes. Then, the predetermined pattern-formation area was irradiated by an i-ray stepper at a radiation rate of 100 mJ/cm². The resultant resist film was baked on a hot plate of 90° C. for 120 seconds and soaked in a 2.38% aqueous TMAH solution for 30 seconds, thereby developing the resist. Thereafter, the resist was washed with water and dried to form resist patterns.

The resist patterns thus-obtained were observed under SEM. It was confirmed that isolated resist patterns were formed in a width of 0.3 µm and that lined-and-spaced resist patterns were obtained also in the same width as that of the isolated resist patterns. The influence of scattered light was not observed.

(COMPARATIVE EXAMPLE 4)

Resist patterns were formed in the same manner and conditions as in Example 4 except that radiation onto the area other than a predetermined pattern-formation area and treatment with a basic compound were not performed. When the resist patterns thus obtained were observed under SEM, it was confirmed that isolated resist patterns were obtained in a width of 0.3 µm but that lined-and-spaced resist patterns were obtained in a different width.

(EXAMPLE 5)

Resist patterns were formed in the same manner and conditions as in Example 1 except that radiation sensitive composition RE-S listed in Table 1 was used.

The resist patterns thus-obtained were observed under SEM. It was confirmed that isolated resist patterns were formed in a width of 0.3 µm and that lined-and-spaced resist patterns were obtained also in the same width as that of the isolated resist patterns. The influence of scattered light was not observed.

(COMPARATIVE EXAMPLE 5)

Resist patterns were formed in the same manner and conditions as in Example 5 except that radiation onto the area other than a predetermined pattern-formation area and treatment with a basic compound were not performed. When the resist patterns thus obtained were observed under SEM, it was confirmed that isolated resist patterns were obtained in a width of 0.3 µm but that lined-and-spaced resist patterns were obtained in a different width.

(EXAMPLE 6)

Resist patterns were formed in the same manner and conditions as in Example 1 except that radiation sensitive composition RE-6 listed in Table 1 was used.

The resist patterns thus-obtained were observed under SEM. It was confirmed that isolated resist patterns were formed in a width of 0.3 µm and that lined-and-spaced resist patterns were obtained also in the same width as that of the isolated resist patterns. The influence of scattered light was not observed.

(COMPARATIVE EXAMPLE 6)

Resist patterns were formed in the same manner and conditions as in Example 5 except that radiation onto the area other than a predetermined pattern-formation area and treatment with a basic compound were not performed. When the resist patterns thus obtained were observed under SEM, it was confirmed that isolated resist patterns were obtained in a width of 0.3 µm but that lined-and-spaced resist patterns were obtained in a different width.

According to the method for use in manufacturing electronic devices of the present invention, fine patterns having a good rectangular cross-section can be formed together with suppressing size alteration caused by scattered light, by subjecting a chemically sensitized resist to photolithography using short-wavelength light such as ultraviolet ray or ionizing radiation. Hence, the method of the present invention can be used in a fine processing step of manufacturing semiconductor devices such as LSI.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming patterns for use in manufacturing electronic devices, comprising the steps of:

forming a radiation sensitive layer on a substrate by coating the substrate with a radiation sensitive composition containing as a first component a compound which generates acid by chemical radiation and as a second component a compound which has at least one bond capable of being decomposed by said acid generated;

irradiating, prior to developing said radiation sensitive layer, an area of said radiation sensitive layer other than a predetermined pattern-formation area of said radiation sensitive layer;

treating a surface of said radiation sensitive layer with a basic compound, thereby inactivating said acid generated in the irradiation area;

irradiating, prior to developing said radiation sensitive layer, said predetermined pattern-formation area of said radiation sensitive layer treated with the basic compound;

applying heat treatment to said substrate; and developing said radiation sensitive layer.

2. The method of forming patterns for use in manufacturing electronic devices, according to claim 1, wherein the area of said radiation sensitive layer within 10 µm around said predetermined pattern-formation area is substantially irradiated in said step of irradiating an area of said radiation sensitive layer other than a predetermined pattern-formation area.

3. The method of forming patterns for use in manufacturing electronic devices, according to claim 1, wherein the area of said radiation sensitive layer within 5.0 µm around said predetermined pattern-formation area is substantially irradiated in said step of irradiating an area of said radiation sensitive layer other than a predetermined pattern-formation area.

4. The method of forming patterns for use in manufacturing electronic devices, according to claim 1, wherein said area of the radiation sensitive layer other than a predetermined pattern-formation area is irradiated in a radiation amount less than a radiation amount with which the pattern-formation area is irradiated.

5. A method of forming patterns for use in manufacturing electronic devices, according to claim 1, wherein said radiation sensitive composition further contains alkali-soluble polymer as a third component.

6. A method of forming patterns for use in manufacturing electronic devices, according to claim 5, wherein said alkali-soluble polymer includes a phenol novolak resin, cresol novolak resin, xylesol novolak resin, and vinylphenol resin.

7. A method of forming patterns for use in manufacturing electronic devices, according to claim 5, wherein said alkali-soluble polymer as the third component is contained in an amount of 90 wt % or less based on a total amount of said second component and the alkali-soluble polymer.

8. A method of forming patterns for use in manufacturing electronic devices, according to claim 5, wherein said alkali-soluble polymer as the third component is contained in an amount of 80 wt % or less based on a total amount of said second component and the alkali-soluble polymer.

9. A method of forming patterns for use in manufacturing electronic devices, according to claim 1, wherein said chemical radiation includes an ultraviolet ray, an X-ray, an electronic beam and an ion beam.

10. A method of forming patterns for use in manufacturing electronic devices, according to claim 6, wherein said ultraviolet ray includes an i-ray, h-ray and g-ray of a mercury lamp and a KrF-ray and ArF-ray of an excimer laser beam.

11. A method of forming patterns for use in manufacturing electronic devices, according to claim 1, wherein said compound as the first component includes diazonium salts, phosphonium salts, sulfonium salts such as $CF_3SO_3^-$, $P-CH_3PHSO_3^-$, and $P-NO_2PHSO_3^-$, iodonium salts, organic halogen compounds, and orthoquinone-diazidosulfonylchloride.

12. A method of forming patterns for use in manufacturing electronic devices, according to claim 1, wherein said compound as the second component includes phenol, cresol, xylesole, bisphenol A, bisphenol S, hydroxybenzophenone, phenolphthalein, polyvinylphenol, and a novolak resin.

13. A method of forming patterns for use in manufacturing electronic devices, according to claim 1, wherein said radiation sensitive composition further contains a surfactant serving as a coating-film reforming agent.

14. A method of forming patterns for use in manufacturing electronic devices, according to claim 1, wherein said radiation sensitive composition further contains a coloring agent serving as a reflection inhibitor.

15. A method of forming patterns for use in manufacturing electronic devices, according to claim 1, wherein content of said compound as the first component falls within the range from 0.1 to 30 wt % based on a solid component of the radiation sensitive composition.

16. A method of forming patterns for use in manufacturing electronic devices, according to claim 1, wherein content of said compound as the first component falls within the range from 0.3 to 15 wt % based on a solid component of the radiation sensitive composition.

17. A method of forming patterns for use in manufacturing electronic devices, according to claim 1, wherein said basic compound includes triethylamine, aniline, pyridine, diethylamine, ammonia, tetramethylammonium hydroxide, hexamethyldisilazane, triphenylamine, 2,4,5-triphenyl imidazole, 2-phenylimidazole, 4,4'-diaminodiphenylmethane, nicotinic acid amide, 2-ethyl imidazole, 3,3'-diamino-4-4'-dihydroxydiphenyl, 2,2,2-trifluoroacetamide, and benzothiazole.

18. A method of forming patterns for use in manufacturing electronic devices, according to claim 1, wherein said step of treating the surface of said radiation-sensitive layer with the basic compound includes a method of exposing a substrate to a gasified basic compound.

19. A method of forming patterns for use in manufacturing electronic devices, according to claim 1, wherein said step of treating the surface of said radiation-sensitive layer with the basic compound includes a method of soaking the substrate in a solution containing the basic compound.

20. A method of forming patterns for use in manufacturing electronic devices, according to claim 1, wherein said step of treating the surface of said radiation-sensitive layer with the basic compound includes a method of spraying a solution containing the basic compound onto the substrate.

21. A method of forming patterns for use in manufacturing electronic devices, according to claim 1, wherein said step of applying heat treatment to the substrate is performed at a temperature of 50° to 150° C.

22. A method of forming patterns for use in manufacturing electronic devices, according to claim 1, wherein said step of developing said radiation-sensitive layer is performed, using an aqueous alkaline solution as a developing solution.

23. A method of forming patterns for use in manufacturing electronic devices, according to claim 22, wherein said aqueous alkaline solution includes an aqueous solution of an inorganic alkali and an aqueous solution of an organic alkali.

24. A method of forming patterns for use in manufacturing electronic devices, according to claim 23, wherein said aqueous alkaline solution contains an alcohol.

25. A method of forming patterns for use in manufacturing electronic devices, according to claim 23, wherein said aqueous alkaline solution contains a surfactant.

26. A method of forming patterns for use in manufacturing electronic devices, according to claim 23, wherein said aqueous solution of the inorganic alkali includes potassium hydroxide, sodium hydroxide, sodium carbonate, sodium silicate, and sodium methasilicate.

27. A method of forming patterns for use in manufacturing electronic devices, according to claim 23, wherein said aqueous solution of the organic alkali includes an aqueous solution of tetramethylammonium hydroxide and an aqueous solution of trimethylhydroxyethylammonium hydroxide.

28. A method of forming patterns for use in manufacturing electronic devices, according to claim 1, wherein said area of the radiation sensitive layer other than a predetermined pattern-formation area is irradiated in a radiation amount less than or equal to a radiation amount in which said predetermined pattern-formation area is irradiated.

29. A method of forming patterns for use in manufacturing electronic devices, according to claim 28, wherein said area of the radiation sensitive layer other than a predetermined pattern-formation area is irradiated in a radiation amount of 30 to 100% to a radiation amount in which said predetermined pattern-formation area is irradiated.

* * * * *